US010994989B2

(12) United States Patent
Rajaraman et al.

(10) Patent No.: US 10,994,989 B2
(45) Date of Patent: May 4, 2021

(54) METHOD FOR PRODUCING A MICROELECTROMECHANICAL COMPONENT AND WAFER SYSTEM

(71) Applicant: Robert Bosch GmbH, Stuttgart (DE)

(72) Inventors: Vijaye Rajaraman, Reutlingen (DE); Eckart Schellkes, Taipei (TW)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/476,455

(22) PCT Filed: Dec. 15, 2017

(86) PCT No.: PCT/EP2017/083069
§ 371 (c)(1),
(2) Date: Jul. 8, 2019

(87) PCT Pub. No.: WO2018/127385
PCT Pub. Date: Jul. 12, 2018

(65) Prior Publication Data
US 2020/0055727 A1   Feb. 20, 2020

(30) Foreign Application Priority Data
Jan. 9, 2017   (DE) ..................... 10 2017 200 162.3

(51) Int. Cl.
*H01L 21/00* (2006.01)
*G01L 9/00* (2006.01)
*B81C 1/00* (2006.01)

(52) U.S. Cl.
CPC .. *B81C 1/00285* (2013.01); *B81B 2201/0264* (2013.01); *B81B 2203/0127* (2013.01); *B81B 2207/012* (2013.01); *B81C 2203/0145* (2013.01); *B81C 2203/031* (2013.01)

(58) Field of Classification Search
CPC ................ B81B 2201/0264; B81B 2203/0127
USPC .............................. 257/416–420; 438/50–53
See application file for complete search history.

(56) References Cited

U.S. PATENT DOCUMENTS

| | | | |
|---|---|---|---|
| 6,432,737 B1 | 8/2002 | Webster | |
| 6,946,728 B2 | 9/2005 | Chen et al. | |
| 8,704,318 B2 * | 4/2014 | Zhou | G01L 19/0069 257/417 |
| 9,011,776 B2 * | 4/2015 | Ziglioli | H04R 1/086 422/68.1 |

(Continued)

FOREIGN PATENT DOCUMENTS

| | | |
|---|---|---|
| DE | 102009001969 A1 | 7/2010 |
| DE | 102010030960 A1 | 12/2012 |

(Continued)

OTHER PUBLICATIONS

International Search Report for PCT/EP2017/083069, dated Mar. 8, 2018.

*Primary Examiner* — Calvin Lee
(74) *Attorney, Agent, or Firm* — Norton Rose Fulbright US LLP; Gerard Messina

(57) ABSTRACT

A method for producing a microelectromechanical component as well as a wafer system includes steps of: providing a first wafer having a plurality of microelectromechanical base elements; forming a respective container structure on the microelectromechanical base elements at the wafer level; and disposing an oil or a gel within the container structures.

12 Claims, 17 Drawing Sheets

(56) References Cited

U.S. PATENT DOCUMENTS

| | | | |
|---|---|---|---|
| 2012/0306031 A1* | 12/2012 | Lo | ......................... H01L 21/561 |
| | | | 257/415 |
| 2013/0113054 A1 | 5/2013 | Yow et al. | |
| 2013/0285167 A1 | 10/2013 | Otte et al. | |
| 2014/0117474 A1* | 5/2014 | Sakai | .................... B81B 7/0058 |
| | | | 257/417 |
| 2015/0221572 A1 | 8/2015 | Chang et al. | |
| 2020/0200634 A1* | 6/2020 | Schiller | ............... G01L 19/0627 |
| | | | 19/147 |

FOREIGN PATENT DOCUMENTS

| | | |
|---|---|---|
| EP | 2423656 A1 | 2/2012 |
| JP | 2016191699 A | 11/2016 |

\* cited by examiner

METHOD FOR PRODUCING A MICROELECTROMECHANICAL COMPONENT AND WAFER SYSTEM

CROSS-REFERENCE TO RELATED APPLICATIONS

The present application is the national stage of International Pat. App. No. PCT/EP2017/083069 filed Dec. 15, 2017, and claims priority under 35 U.S.C. § 119 to DE 10 2017 200 162.3, filed in the Federal Republic of Germany on Jan. 9, 2017, the content of each of which are incorporated herein by reference in their entireties.

FIELD OF THE INVENTION

The present invention relates to a method for producing a microelectromechanical component and to a wafer system.

BACKGROUND

Microelectromechanical components often require protection against dust, particles, moisture, exhaust gases, and/or other corrosive or aggressive media. This applies especially to microelectromechanical sensor devices that must be exposed to an environment in order to fulfill their function. For example, microelectromechanical pressure sensors have at least one deformable, pressure-sensitive diaphragm, the so-called pressure sensor diaphragm, which is typically exposed to an environment containing a corrosive medium. Pressure signals are detected and subsequently evaluated using a pressure sensor circuit, for example a bridge circuit, on the pressure sensor diaphragm. The sensitive pressure sensor diaphragm must be exposed in some manner to sound waves from the environment.

A known solution from the related art is to insulate a finished microelectromechanical pressure sensor element at the packaging level using a gel or an oil. Physical signals such as sound waves, for example, propagate through the oil or the gel to reach the pressure sensor diaphragm, for example. The oil or gel thus does not interfere with the measurement, while providing at the same time an insulation of the pressure sensor diaphragm from the environment. An exemplary method for hermetically sealing a MEMS (microelectromechanical system) package is described in U.S. Pat. No. 6,946,728 B2 for example.

U.S. Pat. No. 6,432,737 B1 describes a method for producing gel containers around pressure sensor elements on a wafer. A form tool is brought into contact with the pressure sensor elements and an encapsulation material is conducted around the pressure sensor elements so that after removal of the form tool, gel containers are formed by the hardened encapsulation material in the area of the pressure sensor elements, which can then be filled with a gel.

US 2012/0306031 A1 describes a method for producing gel containers around piezoresistive transducers, in which first lateral walls are disposed around the transducers and thereupon lids are glued onto the lateral walls using an adhesive. The adhesive is hardened by heating in an oven.

US 2014/0117474 A1 describes a microelectromechanical pressure sensor element having a gel filling, in which a tubular element, which is largely free of gel, is situated above the sensor diaphragm of the pressure sensor element.

SUMMARY

The present invention is directed to a microelectromechanical component, a wafer system, and a method for production thereof.

According to an example embodiment of the present invention, a method for producing a microelectromechanical component includes: providing a first wafer having a plurality of microelectromechanical base elements; forming a respective container structure around the micromechanical base elements, on the microelectromechanical base elements or at the microelectromechanical base elements, in particular at the wafer level; and disposing an oil or a gel within the container structures, in particular at the wafer level.

A microelectromechanical base element is to be understood as a microelectromechanical element that represents a component part of the microelectromechanical component to be produced. The microelectromechanical base element can be a MEMS structure for example, that is, a microelectromechanical system, in particular a MEMS sensor, very particularly a MEMS pressure sensor, an application-specific integrated circuit (ASIC) and the like.

A container structure is to be understood as any structure that is capable of receiving either an oil or a gel and of keeping it in a specific location. Examples of container structures are for example closed annular structures, having a circular or rectangular cross section for example, covers or hoods, which form a closed space together with the wafer, which is filled at least partially or completely with oil or gel, hollowed-out rectangular parallelepipeds and the like.

That a method step is to be performed at the wafer level is to be understood in particular as that the corresponding method step can be performed simultaneously on a multitude of microelectromechanical base elements on a wafer before the individual microelectromechanical base elements are separated from the wafer.

Processing at the wafer level thus differs from processing at the package level, at which already separated microelectromechanical components are individually packaged, which usually entails a greater effort. Instead of processing at the wafer level, it is alternatively also possible to work with chip-scale packages.

In addition, a microelectromechanical component is provided, including a wafer, on which at least one microelectromechanical base element is disposed or attached. The microelectromechanical base element can be in particular a MEMS pressure sensor. A first container structure is developed around the microelectromechanical base element or on the microelectromechanical base element, in which an oil or gel is disposed. Around the microelectromechanical base element and the container structure, a second container structure is disposed or attached on the wafer. Another oil or gel is disposed in the additional container structure.

If the microelectromechanical base element is a MEMS sensor having a pressure sensor diaphragm, the oil or gel is preferably disposed in the first container structure in such a way that the pressure sensor diaphragm is covered by it, and moreover the oil or gel in the second container structure is preferably disposed in such a way that the base element and/or the first container structure is/are covered by it.

Furthermore, a wafer system is provided, including a first wafer having a plurality of microelectromechanical base elements and container structures, which are disposed around the microelectromechanical base elements or on the microelectromechanical base elements, an oil or a gel being respectively disposed in the container structures. Preferably, a respective container structure is disposed on each of the microelectromechanical base elements. The same oil or the same gel, different oils and/or different gels can be disposed in the individual container structures so that even at the wafer level it is possible to produce different microelectromechanical components on one and the same wafer.

The wafer can be in particular a silicon wafer, which can be developed having electrical contacts such as printed conductor tracks, through-hole contacts and the like.

The present invention advantageously allows for producing microelectromechanical components at the wafer level, which are at least in areas protected against environmental influences by container structures filled with an oil or a gel. It is thus possible to produce microelectromechanical components in a particularly robust manner and at the same time with particularly small technical effort. This is particularly advantageous for microelectromechanical pressure sensor systems. The microelectromechanical base element can advantageously be a MEMS pressure sensor having a cavity, which is separated from the environment by a pressure sensor diaphragm. The container structure can be developed in such a way that it encloses the pressure sensor diaphragm, or another diaphragm, laterally, which makes it possible to dispose the oil or the gel above the pressure sensor diaphragm and hold it there. The pressure sensor diaphragm is thus shielded against dust, particles, moisture, exhaust gases, and/or other corrosive and/or aggressive media.

Furthermore, it becomes possible to shield for example metallic bonding pads on MEMS components or MEMS base elements or ASICs against direct environmental influences such as from corrosive fluids, for example.

According to an example embodiment, the formation of the container structures comprises the steps of: forming a polymer layer on the microelectromechanical base elements; and patterning the polymer layer. Instead of one polymer layer, it is also possible to form and pattern multiple polymer layers.

The patterning of the polymer layer can be performed for example by photolithography and/or by etching. In this manner, the container structures can be produced with small technical effort using fully developed methods known in the related art, which allows for quick, safe, and cost-effective processing.

According to an example embodiment, the formation of the container structures includes the step of attaching at least one microelectromechanical and/or micromechanical structure, e.g., a cap, on the microelectromechanical base elements. The attachment of the at least one microelectromechanical or micromechanical structure on the microelectromechanical base elements can be performed for example by adhesive wafer bonding, in particular when using a wafer made of silicon or of glass. Moreover, in particular when using a glass wafer, it is possible to perform anodic wafer bonding. The glass wafer can be in particular a glass-cap wafer, that is, a glass wafer that is designed for providing glass caps for a multitude of microelectromechanical base elements on the wafer.

Accordingly, the attachment of the at least one microelectromechanical or micromechanical structure on the microelectromechanical base elements can be performed preferably by connecting a second wafer with the first wafer. Preferably, respectively one microelectromechanical or micromechanical structure is attached on each microelectromechanical base element so that each microelectromechanical base element is developed having its own container structure. Preferably, the attachment of respectively one microelectromechanical or micromechanical structure on each of the microelectromechanical base elements thus occurs simultaneously or essentially simultaneously.

The attachment of the at least one microelectromechanical or micromechanical structure on the microelectromechanical base elements can furthermore be performed by attaching an annular structure, for example made from a plastic, a glass or a metal, on the microelectromechanical base elements or around the microelectromechanical base elements by using known adhesion methods.

According to an example embodiment, the oil is placed by filling the oil into a filler opening developed in the container structure, the filler opening being closed after placement of the oil in the container structure, whereupon the container structure has no further openings to the outside world and the oil is thus advantageously enclosed by the container structure.

According to an example embodiment, the microelectromechanical base elements are pressure sensors, that is, MEMS pressure sensors, which are each developed having a pressure sensor diaphragm. The respective container structure can be situated and developed in such a way that an outer side of the pressure sensor diaphragm is covered by the oil or gel disposed in the container structure. Thus it is possible to protect the often sensitive pressure sensor diaphragm and bonding pads situated on the pressure sensor diaphragm against environmental influences.

According to yet an example embodiment, an application-specific integrated circuit, ASIC, is situated within the container structure in addition to the oil or the gel and is connected electrically and/or mechanically to the microelectromechanical base element. In this manner, the container structure and the oil or gel disposed in it are able to protect also the bonding pads, conductors or contacts on the application-specific integrated circuit or connections of the application-specific integrated circuit to the microelectromechanical base element against environmental influences.

According to an example embodiment, the microelectromechanical base elements are connected electrically and/or mechanically to the wafer. Advantageously, another container structure, in which another gel is disposed, can be situated around the microelectromechanical base elements with their respectively associated container structures. This makes it possible for example to select different gels and situate them successively for protecting the base elements, which gels are adapted to the respective application. Furthermore, contacts, conductors, and connections such as for example bonding wires between the microelectromechanical base element and for example an application-specific integrated circuit on the same wafer can likewise be shielded by gel from the outside world.

In the following, the present invention is explained in greater detail with reference to the example embodiments shown in the schematic figures of the drawings in which, unless indicated otherwise, identical or functionally equivalent elements and devices have been provided with the same reference symbols. The numbering of method steps is used for clarity and generally is in particular not intended to imply a specific sequence in time, unless indicated otherwise. In particular, it is also possible to carry out multiple method steps at the same time.

DETAILED DESCRIPTION

Figure 1:
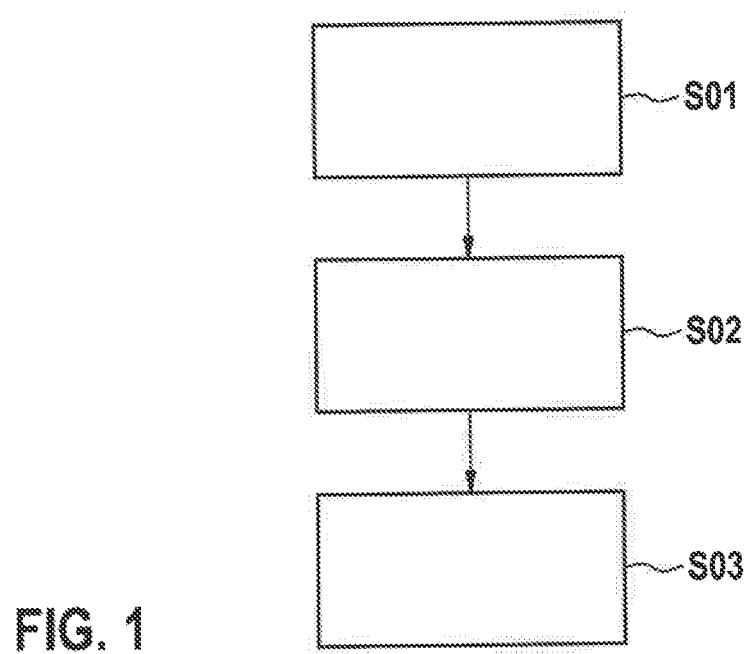
FIG. 1 is flowchart that illustrates a method for producing a microelectromechanical component according to an example embodiment of the present invention.

FIG. 1 shows a schematic flowchart for explaining a method for producing a microelectromechanical component according to an example embodiment of the present invention. In a step S01, a first wafer having a plurality of microelectromechanical base elements is provided, in particular produced. The wafer can be in particular a silicon wafer. The microelectromechanical base elements for their part can be connected electrically and/or mechanically to the first wafer, for example by bonding, or can be developed in the first wafer.

In a step S02, a respective container structure is developed on the microelectromechanical base elements, preferably at the wafer level. Alternatively, the base elements can also be separated from one another together with respective parts of the wafer and be processed further as chip-scale packages.

In a step S03, an oil or a gel is situated within the container structures, preferably likewise at the wafer level, e.g., by filling.

Figure 2:
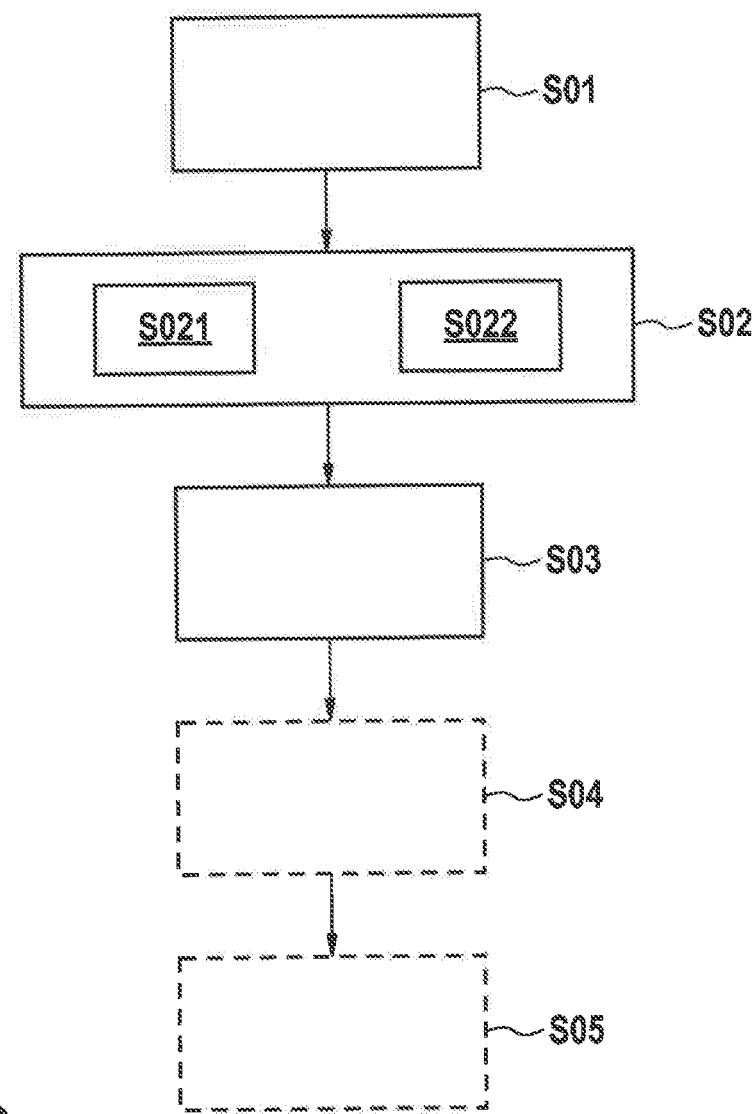
FIG. 2 is flowchart that illustrates a method for producing a microelectromechanical component according to another example embodiment of the present invention.

FIG. 2 shows a schematic flowchart for explaining a method for producing a microelectromechanical component according to another example embodiment of the present invention. The method according to FIG. 2 represents a variant of the method according to FIG. 1.

According to the method shown in FIG. 2, the formation S02 of the container structures includes the following steps: in a step S021, a polymer layer is formed on the microelectromechanical base elements. In a step S022, the polymer layer is patterned. In an optional step S04, the container structure can be sealed, preferably hermetically. Step S04 is preferably performed if an oil is used in step S03. When using a gel, it is possible for the container structure to remain unsealed in some applications, which can entail advantages, for example a lower weight of the component and lower technical effort in production. In an optional step S05, another microelectromechanical element can be electrically connected to the base element. Subsequently, the individual finished microelectromechanical components can be separated from one another.

Preferred developments are explained in the following with reference to FIGS. 3a-3c, which show already separated and finished microelectromechanical components 100a-100c for better comprehensibility. It shall be understood, however, that the indicated structures and method steps are preferably formed and, respectively, performed at the wafer level or the chip-scale-package level.

Figure 3A:
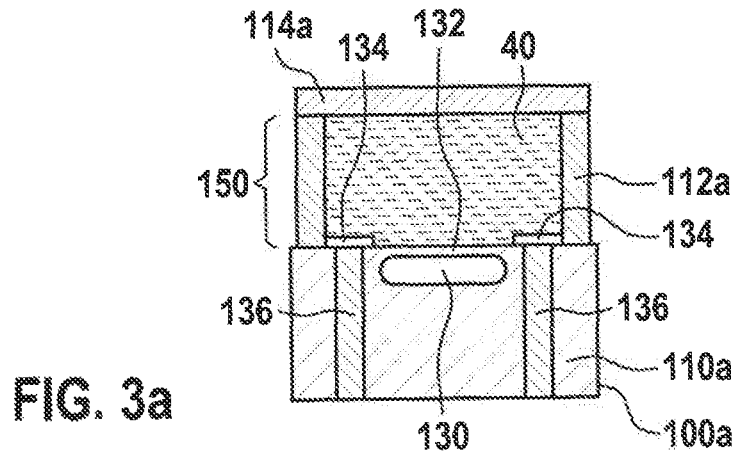
FIGS. 3a-3c are schematic cross-sectional representations of microelectromechanical components according to example embodiments of the present invention.

FIG. 3a shows a microelectromechanical component 100a, which is producible according to a variant of the method shown in FIG. 2. According to FIG. 3a, the provided microelectromechanical base element 110a can be a MEMS pressure sensor having a cavity 130, the cavity 130 in the case of base element 110a being sealed off from the environment by a pressure sensor diaphragm 132. Adjacent to diaphragm 132, on the same side of base element 110a as diaphragm 132, electrical contacts or resistors 134, e.g., piezo resistors, are situated, which are connected by through-hole contacts 136 to a back side of base element 110a, that is, an outer side facing away from the outer side having diaphragm 132.

In step S021, it is possible for a polymer layer 150 to be formed on the outer side of base element 110a that has diaphragm 132, in particular prior to forming the contacts or resistors 134, which polymer layer 150 is subsequently patterned in step S022, for example by photolithography or etching. The patterning S022 of polymer layer 150 occurs in particular in such a way that the remaining parts of polymer layer 150 have a closed annular structure, which laterally encloses diaphragm 132 and the contacts or resistors 134 that are formed or are to be formed later. Disposing S03 oil 40 can occur by filling the annular structure remaining from polymer layer 150, which thus functions as a container structure 112a.

In order to prevent the oil 40 from escaping from container structure 112a, container structure 112a can be subsequently sealed, preferably hermetically, by a sealing element 114a in the optional step S04 of the method according to FIG. 2. Sealing element 114a can be a film or a plate, for example. To connect the sealing element 114a to container structure 112a, a film can be used for example as sealing element 114a, which is capable of being thermally activated, that is, which fuses with adjacent elements, in this case container structure 112a, when heated.

The film can be made of a plastic or a polymer. The film can also be a metal foil or be developed from a mixture of a metal and a polymer. The film can be a pouch foil, for example. The film can be flexible and thus function as a diaphragm transmitting pressure from one side to the other.

In the optional step S04 of the method shown in FIG. 2, container structure 112a including the oil 40 disposed in it can thus be sealed, for example by applying heat to the film placed on container structure 112a as sealing element 114a. Alternatively, it is also possible to use an adhesive technology for connecting sealing element 114a to container structure 112a for enclosing oil 40, which can be performed for example by using UV light or heat, for example in order to glue a plate as sealing element 114a to container structure 112a. Bonding technologies can be used as well.

Following the optional sealing S04 of container structure 112a, in a further optional step S05, a further microelectromechanical element 120, for example an application-specific integrated circuit, ASIC, can be connected electrically to base element 110a via through-hole contacts 136.

Figure 3B:
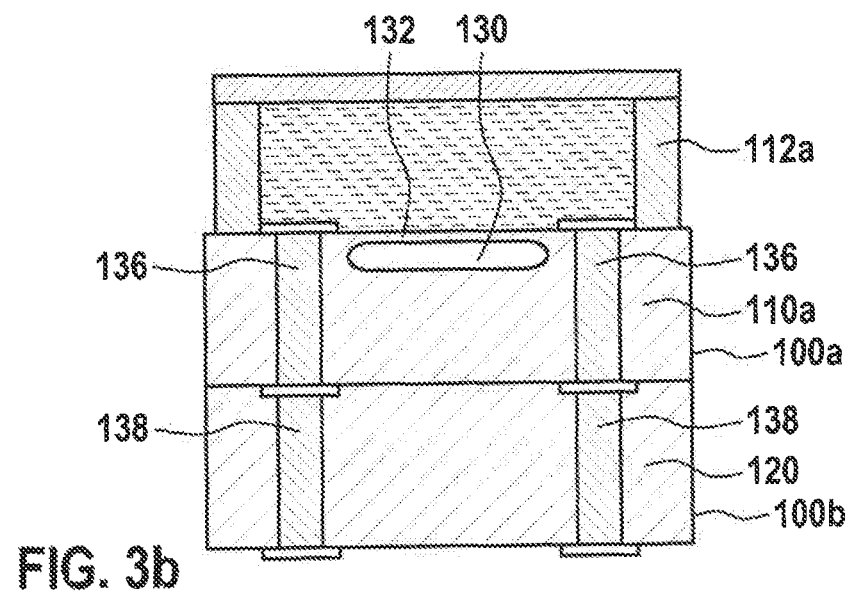

FIG. 3b shows a microelectromechanical component 100b, which is producible according to such a variant of the method shown in FIG. 2.

In particular, the additional microelectromechanical element 120 can be designed to evaluate pressure sensor signals of the base element 110a designed as a pressure sensor. The particularly compact, layered system made up of container structure 112a, base element 110a, and the additional microelectromechanical element 120 on the side of base element 110a facing away from diaphragm 132 can thus form microelectromechanical component 100b, which is producible using the method described herein. The pressure sensor signals and/or the signals produced by the additional microelectromechanical element 120 can be tapped through additional through-hole contacts 138 through the additional microelectromechanical element 120.

Figure 3C:
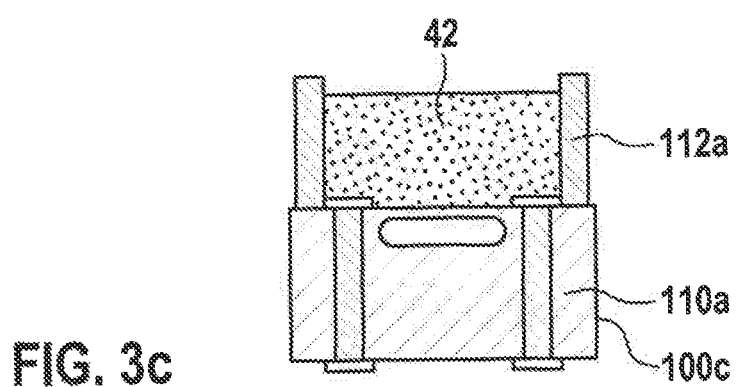

FIG. 3c shows a microelectromechanical component 100c, which is producible according to another variant of the method shown in FIG. 2. FIG. 3c illustrates an alternative to the method shown in FIG. 3a, in which the annular structure remaining from polymer layer 150, which functions as container structure 112a, is filled, entirely or partially, with a gel 42 instead of with oil 40. In this case, due to the advantageously high viscosity of the gel, it is possible to do without sealing the container structure 112a, as shown in FIG. 3c.

Figure 4:
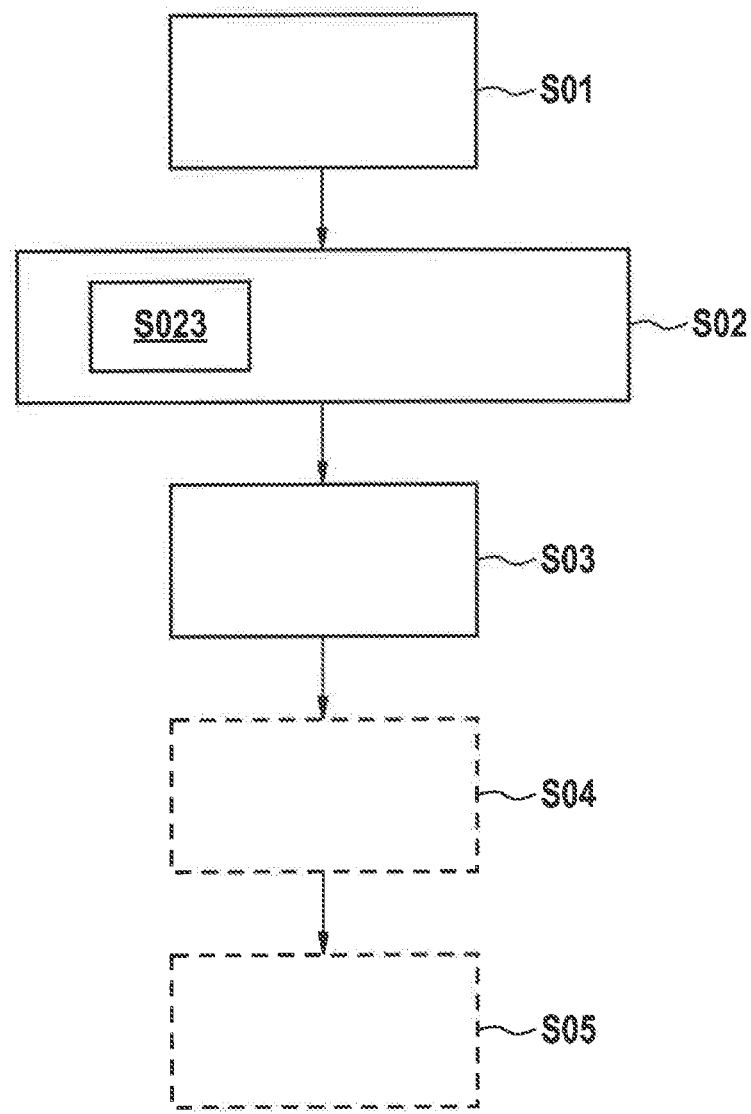
FIG. 4 is flowchart that illustrates a method for producing a microelectromechanical component according to another example embodiment of the present invention.

FIG. 4 shows a schematic flowchart for explaining a method for producing a microelectromechanical component according to another example embodiment of the present invention. The method shown in FIG. 4 is a variant of the method shown in FIG. 2. The method according to FIG. 4 comprises the formation S02 of the container structures and a step S023, in which at least one, preferably one of each, microelectromechanical or micromechanical structure is attached on the microelectromechanical base elements. As already described above, the additional microelectromechanical or micromechanical structure can be situated in particular by connecting a second wafer to the first wafer on microelectromechanical base elements.

Figure 5A:
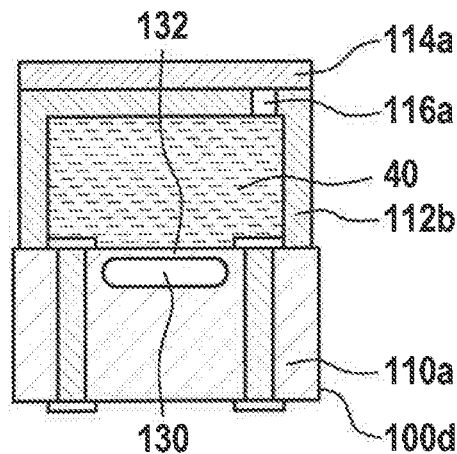
FIGS. 5a-5c are schematic cross-sectional representations of microelectromechanical components according to further example embodiments of the present invention.

FIG. 5a shows a microelectromechanical component 100d, which is producible according to a variant of the method shown in FIG. 4. FIG. 5a illustrates in particular a method in which a micromechanical cap 112b, e.g., a so-called MEMS cap, is disposed on base element 110a from FIG. 3a as a micromechanical structure, in particular by bonding the micromechanical cap on the outside of base element 110a, on which diaphragm 132 is also situated. Micromechanical cap 112b, which functions as a container structure, has at least one filler opening 116a through which the oil 40 is filled into the container structure after attaching S023 micromechanical cap 112b. After the oil 40 has been filled in, the micromechanical cap 112b can be closed by a film or a plate as sealing element 114a, as described with reference to FIG. 3a for example.

Micromechanical cap 112b can be made in particular of glass or silicon. The second wafer, which is designed for attaching micromechanical caps 112b on base elements 110a at the wafer level, can thus be referred to as a glass-cap wafer.

As an alternative to the method described with reference to FIG. 5a, micromechanical cap 112b can be closed in another manner, which produces a microelectromechanical component 100e shown schematically in FIG. 5b.

Figure 5B:
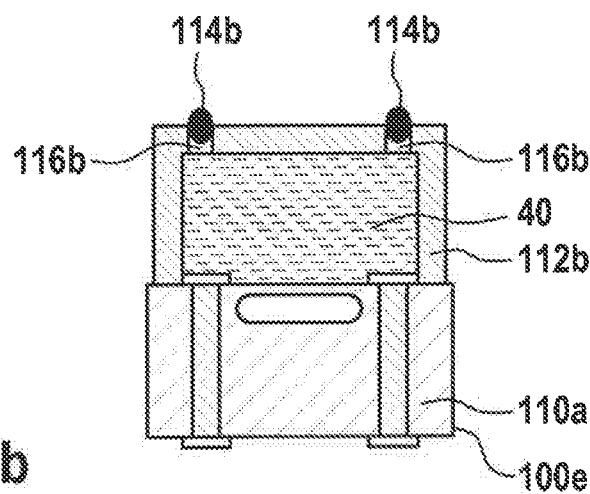

FIG. 5b schematically shows that micromechanical cap 112b has two filler openings 116b, which are respectively closed by a solder ball 114b or a metal seal as sealing element. In other words, for sealing S04 the micromechanical cap 112b functioning as a container structure, it is possible to perform a method step in which solder balls are applied specifically onto the filler openings 116b of cap 112b for sealing filler openings 116b. Like the attachment S023 of micromechanical caps 112b on all base elements 110a, it is also possible to perform the filling or disposing of oil 40 in cap 112 and the sealing of the filler opening 116b or filler openings 116b by a film or plate or by soldering balls 114b at the wafer level.

Figure 5C:
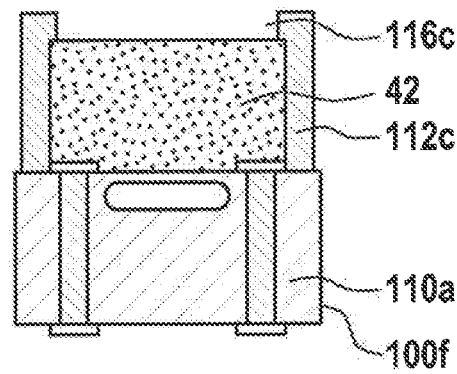

FIG. 5c explains a production method, which represents a variant of the method described with reference to FIG. 5a, a microelectromechanical component 100f being produced in the process. As in the method described in connection with FIG. 3c, a gel 42 is used instead of an oil 40 in the method illustrated in FIG. 5c. The container structure can thus be formed by a micromechanical cap 112c, which has for example a single, comparatively large-area filler opening 116c. Filler opening 116c is used to fill gel 42 into the cavity defined by cap 112c and can subsequently remain unsealed, which represents a particularly simple method.

Figure 6:
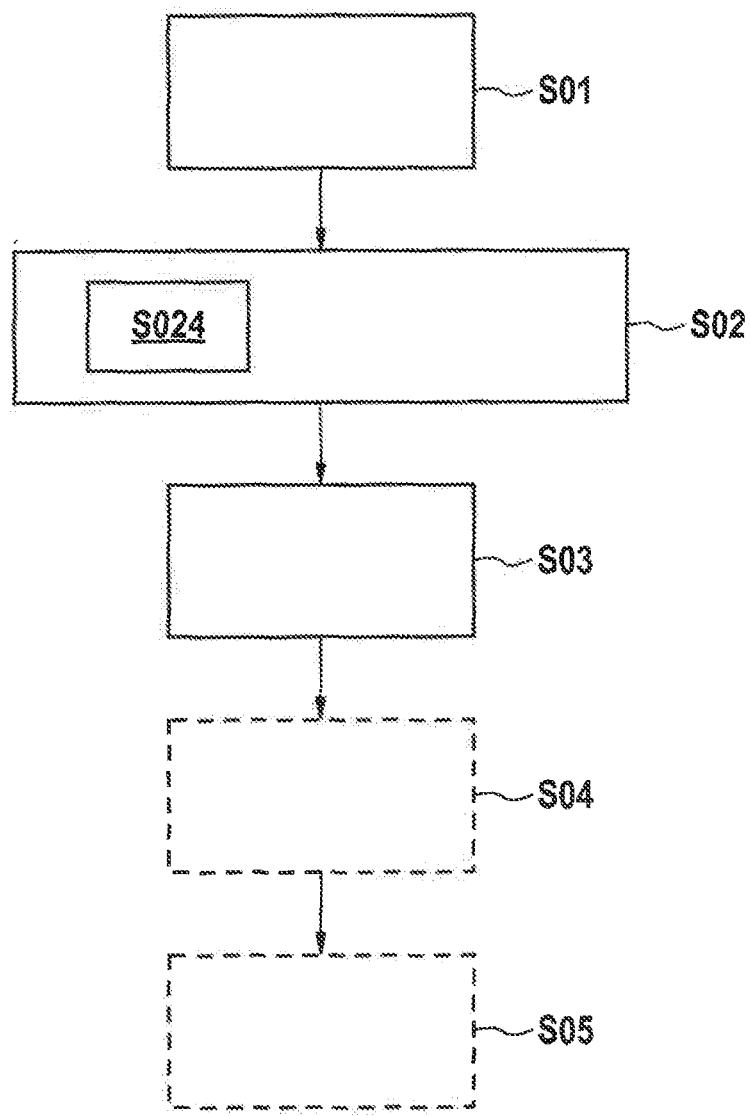
FIG. 6 is flowchart that illustrates a method for producing a microelectromechanical component according to yet another example embodiment of the present invention.
Figure 7:
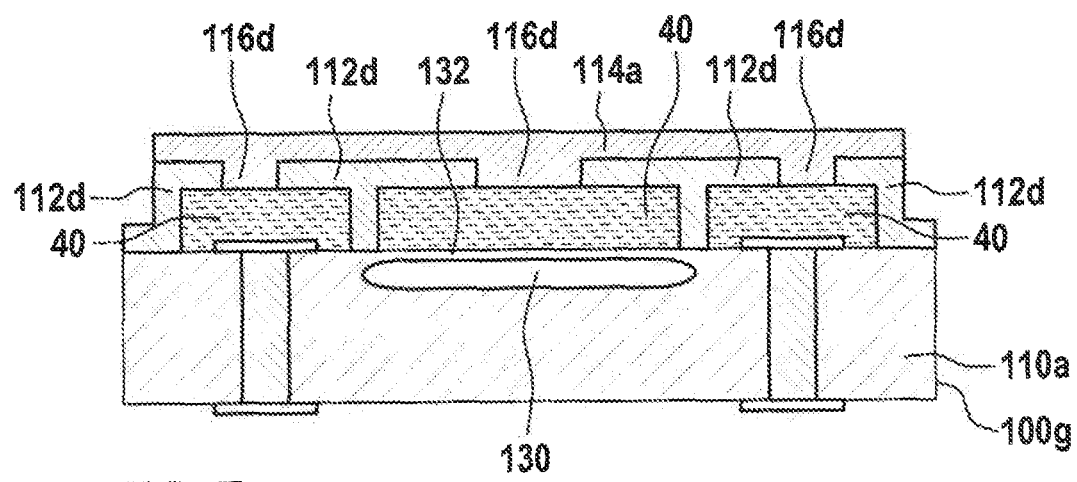
FIG. 7 is a schematic cross-sectional representation of a microelectromechanical component according to an example embodiment of the present invention.

FIG. 6 shows a schematic flowchart for explaining a method for producing a micromechanical component according to another example embodiment of the present invention. The method shown in FIG. 6 is a variant of the method shown in FIG. 2. In the method as shown in FIG. 6, the formation S02 of the container structure comprises a formation S024 of a thin-film encapsulation 112d, for example as shown in FIG. 7 with reference to a microelectromechanical component 100g.

Thin-film encapsulation 112d can be produced for example by sputtering or by chemical vapor deposition (CVD). Thin-film encapsulation 112d can be designed with filler openings 116d, which can be closed using a film or a plate as sealing element 114a, for example as described with reference to FIG. 3a.

Figure 8:
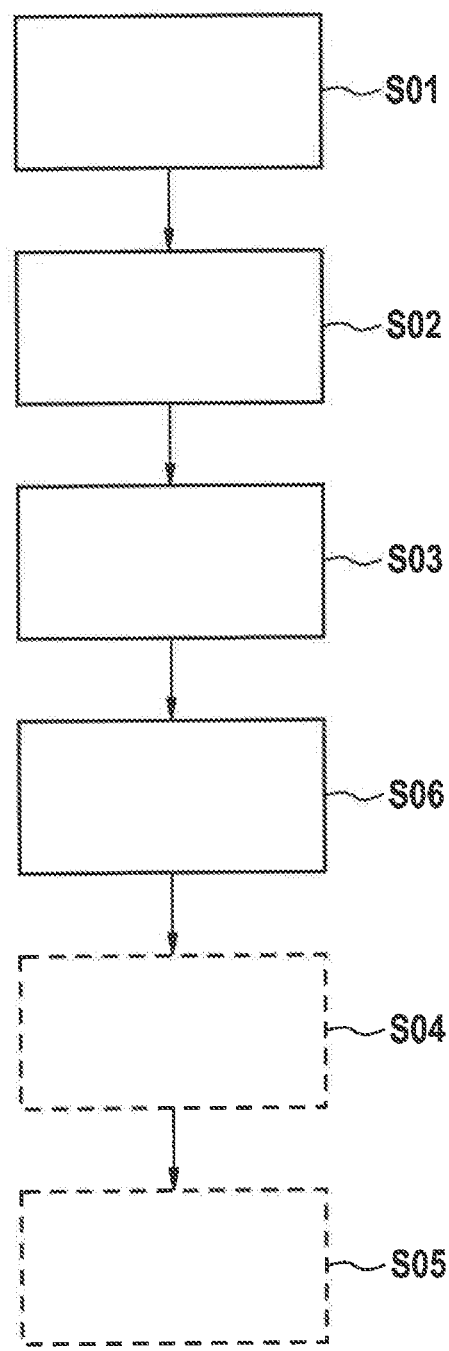
FIG. 8 is flowchart that illustrates a method for producing a microelectromechanical component according to yet another example embodiment of the present invention.

FIG. 8 shows a schematic flowchart for explaining a method for producing a micromechanical component 100h; 100i; 100k; 100l according to further example embodiments of the present invention. The method as shown in FIG. 8 is a variant of the method as shown in FIG. 1 and differs from the latter in particular in that in a step S06 an application-specific circuit, ASIC 122a; 122b is disposed within the oil 40 or the gel 42 within the container structure. The method as shown in FIG. 8 is explained in more detail in the following with reference to FIGS. 9a-9d. It shall be understood that step S02 of the method shown in FIG. 8 can be performed as explained with reference to FIG. 2, 4, or 6. The method according to FIG. 8 can likewise have the optional step S04 and S05, as was explained e.g., with reference to FIG. 2.

Figure 9A:
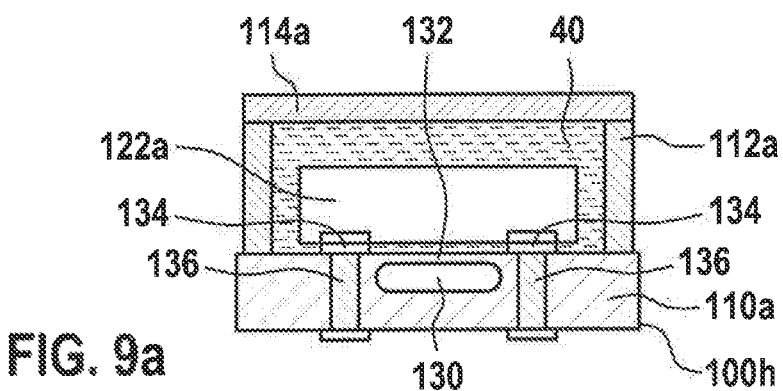
FIGS. 9a-9d are schematic cross-sectional representations of microelectromechanical components according to further example embodiments of the present invention.

FIG. 9a illustrates a variant of the method according to FIG. 8 and shows a micromechanical component 100h, in which on top of a base element 110a, as described with reference to FIG. 3a, a container structure 112a having a sealing element 114a is developed, as likewise described with reference to FIG. 3a. Within oil 40 and within container structure 112a, an ASIC 122a is disposed and is connected electrically and mechanically via contacts of ASIC 122a with the contacts or resistors 134 of base element 110a.

Figure 9B:
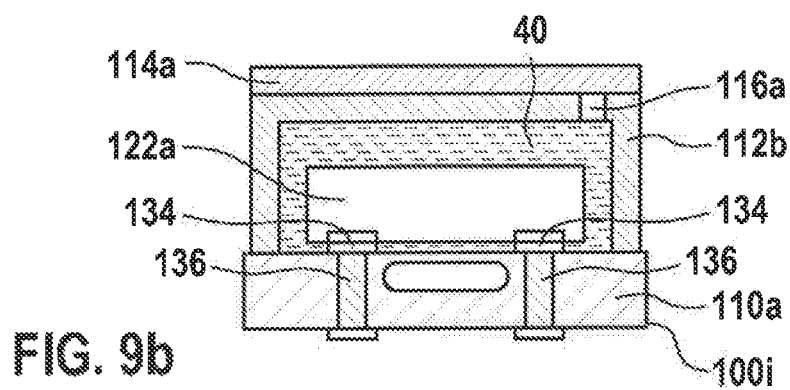

As illustrated with reference to FIG. 9b, a microelectromechanical component 100i can also be produced in that the ASIC 122a is disposed for example within the micromechanical cap 112b of microelectromechanical component 100d, as described with reference to FIG. 9a. In particular, it is possible first to bond ASIC 122a to the contacts or resistors 134 of base element 110a and thereupon to bond micromechanical cap 112b around ASIC 122a onto base element 110a. Subsequently, cap 112b can be filled with oil 40 and sealed using sealing element 114a, as described for example with reference to FIG. 5a. Alternatively, filler opening 116 of cap 112b can also be sealed using solder balls, for example as described with reference to FIG. 5b.

Figure 9C:
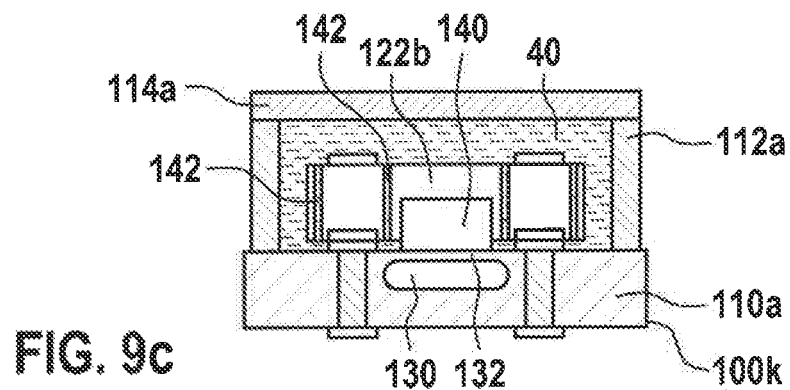

Within the container structure, it is also possible to dispose an ASIC 122b, as also illustrated by FIG. 9c, which has a block-shaped bulge, ASIC 122b being situated on base element 110a in such a way that the bulge comes to lie exactly above diaphragm 132 of base element 110a and thus produces another cavity 140 directly adjacent to diaphragm 132. For pressure equalization, for example, channels 142 can be formed through ASIC 122b. As indicated in FIG. 9c, these channels 142 can be developed having a small diameter so that a pressure equalization can occur between cavity 140 and the oil 40 surrounding ASIC 122b, but that at the same time only small quantities of oil 40 are able to enter cavity 140.

According to FIG. 9c, a container structure 112a as well as an associated sealing element 114a is developed in component 100k, as described with reference to FIG. 3a. It goes without saying that it is also possible to use all other methods and variants described above for forming a container structure on the base element.

Figure 9D:
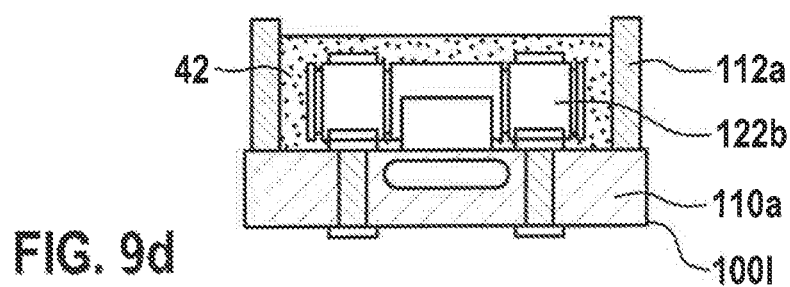

FIG. 9d shows the case for example in which ASIC 122b is formed by the container structure as described in FIG. 3c, that is, filled with a gel 42 and unsealed.

Of course, it is also possible to situate any other ASICs, surrounded by a gel 42, in an unsealed container structure 112a.

Figure 10A:
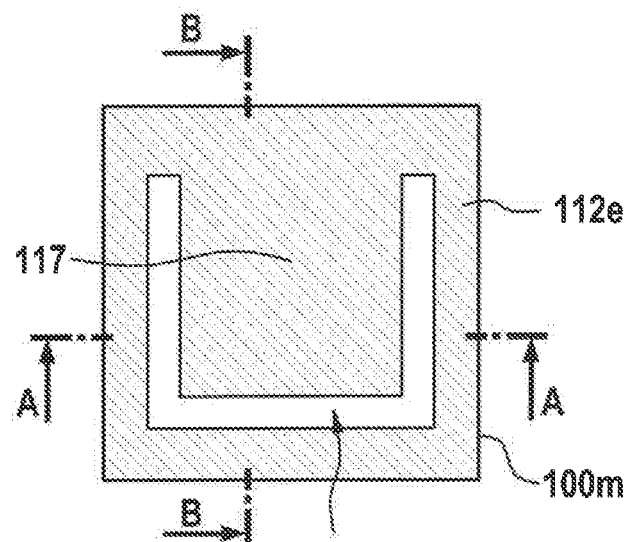
FIGS. 10a-10c are schematic sectional representations of a microelectromechanical component according to another example embodiment of the present invention.
Figure 10B:
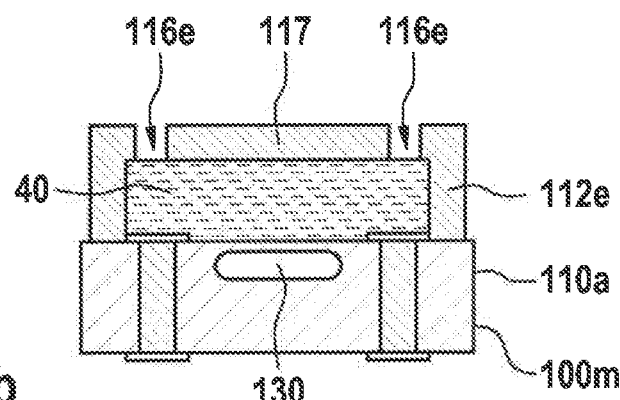
Figure 10C:
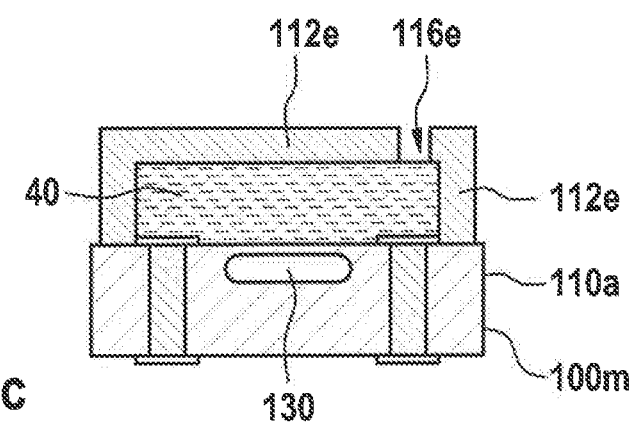

FIGS. 10a-10c show schematic sectional illustrations of a microelectromechanical component 100m according to yet another example embodiment of the present invention.

FIG. 10a shows a schematic top view onto component 100m, FIG. 10b a cross section along the line A-A in FIG. 10a, and FIG. 10c a cross section along the line B-B in FIG. 10a.

Component 110m is a variant of component 100d or of component 100e and differs from these in that it has a container structure 112e instead of container structure 112b. Container structure 112e differs from container structure 112b in the shape of filler opening 116e of container structure 112e, which, as shown in FIG. 10a, is designed to be U-shaped. The area of the cover of container structure 112e that is enclosed on three sides by the U-shape is thus designed as a cantilever 117. The size of filler opening 116e is exaggerated in FIGS. 10a-10c.

Figure 11A:
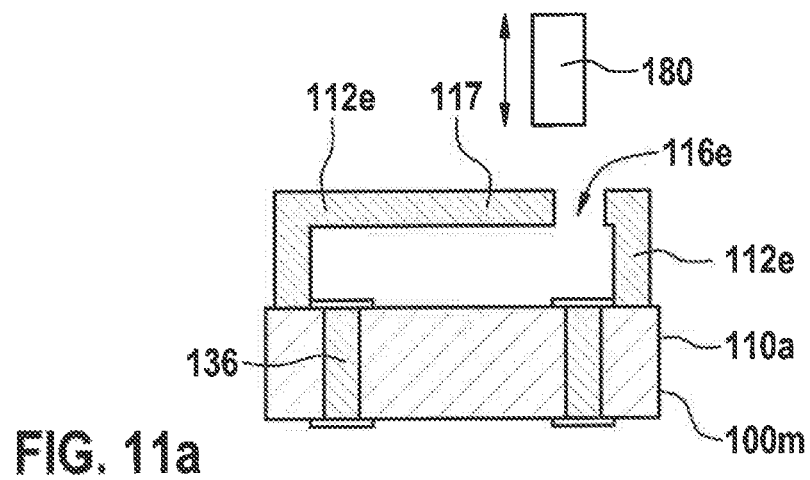
FIGS. 11a-11c are schematic sectional representations for explaining a production method for the microelectromechanical component shown in FIGS. 10a-10c.
Figure 11B:
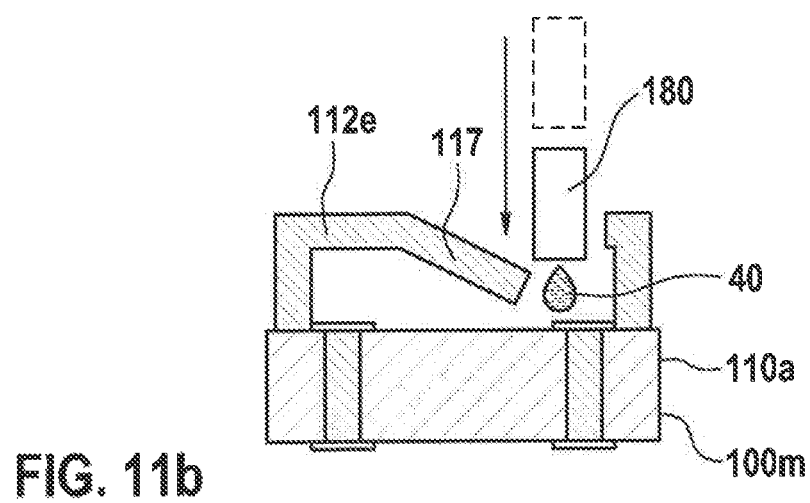
Figure 11C:
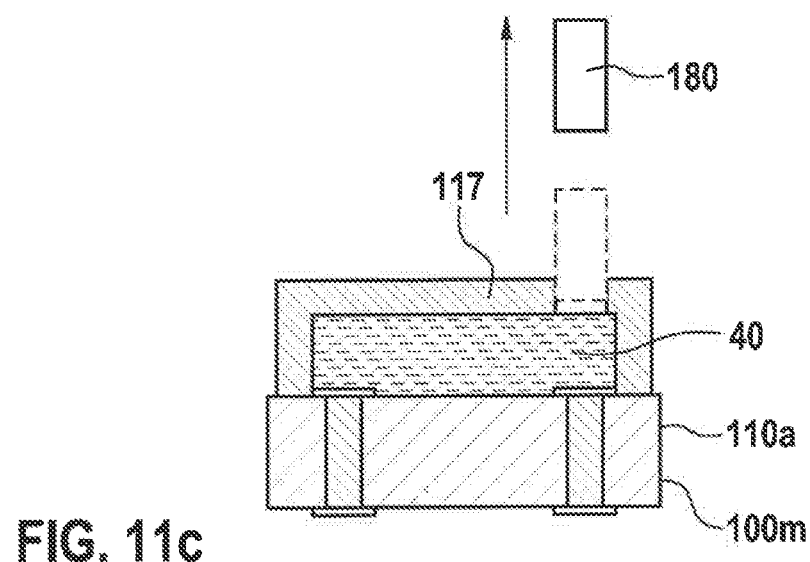

FIGS. 11a-11c show schematic cross-sectional illustrations of component 100m analogous to FIG. 10c, i.e., along the sectional line B-B in FIG. 10a, for explaining a production method for microelectromechanical component 100m. Component 100m can first be developed as described with reference to component 100d or component 100e. For disposing S03 oil 40 in container structure 112e, it is then possible to move a filler nozzle 180 in the direction of filler opening 116e, as illustrated in FIG. 11a. Using filler nozzle 180, cantilever 117 can be pressed in the direction of base element 110a so that an access is created for oil 40 from filler nozzle 180 into the area comprised by container structure 112e (FIG. 11b). After disposing S03 oil 40, filler nozzle 180 is again pulled away from base element 110a (FIG. 11c).

Due to the elastic properties of the material of container structure 112e, which is advantageously formed, e.g., from silicon, cantilever 117 thereupon closes automatically. Cantilever 117 thus functions as an open/closed valve. Filler opening 116e is adjusted to oil 40 in such dimensions that when cantilever 117 is closed the oil 40 remains in container structure 112e due to the tight filler opening 116e and the surface tension of oil 40. An additional sealing of the filler opening 116e can thus be omitted. Developing component 100m in the manner described, in particular situating S03 oil 40, can be performed for separated components, but is advantageously performed at the wafer level for a multitude of components 100m simultaneously.

Figure 12A:
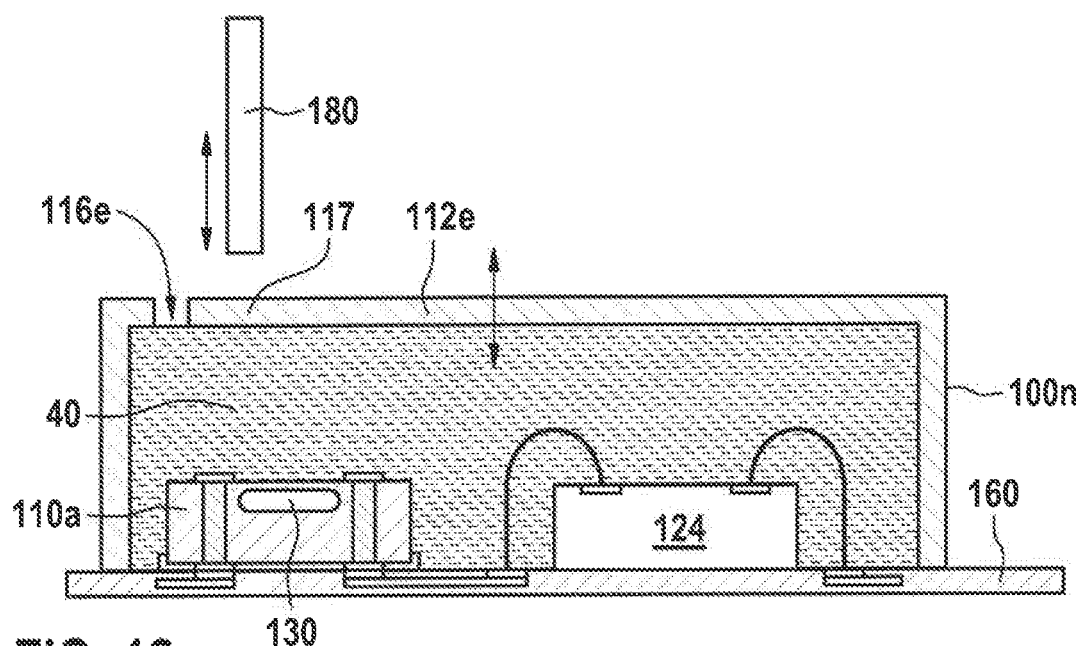
FIGS. 12a and 12b are schematic cross-sectional representations of a microelectromechanical component according to another example embodiment of the present invention.
Figure 12B:
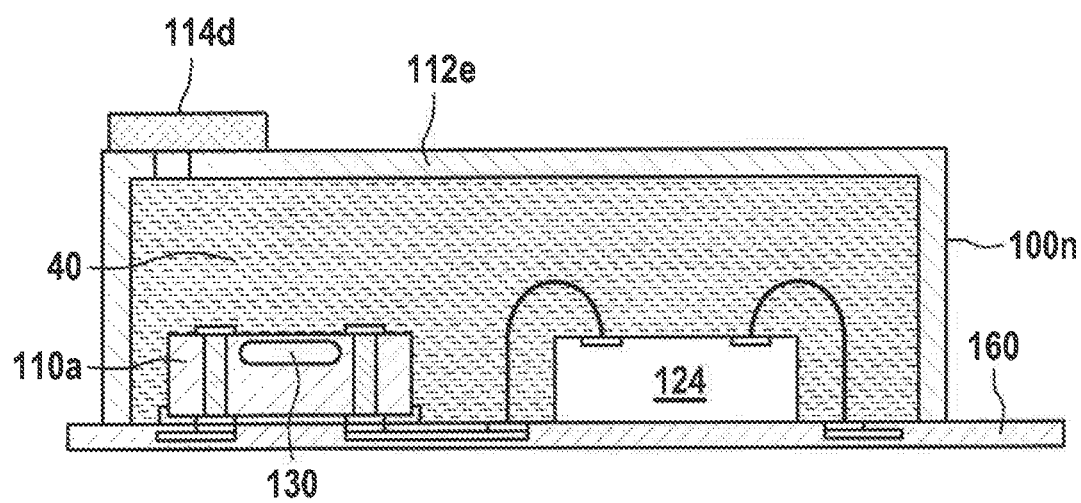

FIGS. 12a and 12b show schematic cross-sectional illustrations of a microelectromechanical component 100n according to another example embodiment of the present invention.

Microelectromechanical components 100n is a variant of microelectromechanical component 100m and differs from the latter in that container structure 112e is not situated directly on base element 110a itself, but rather on a wafer 160 and surrounds base element 110a, which is likewise situated on wafer 160.

Optionally, another microelectromechanical element electrically connected to base element 110a, for example an ASIC 124, can be situated within container structure 112e. As indicated in FIG. 12a, container structure 112e can be likewise filled with oil 40 as described with reference to FIGS. 11a-11c. Optionally, as shown in FIG. 12b, filler opening 116e can be sealed by a sealing element 114d, for example by a porous membrane.

The microelectromechanical component 100n shown in FIG. 12a can represent a wafer system, i.e., a system of a multitude of base elements 110a, ASICs 124 and container structures 112e on one and the same wafer 160. Alternatively, the microelectromechanical component 100n shown in FIG. 12a can also be completed, in particular filled with oil 40, at the package level, that is, e.g., after separation.

Figure 13:
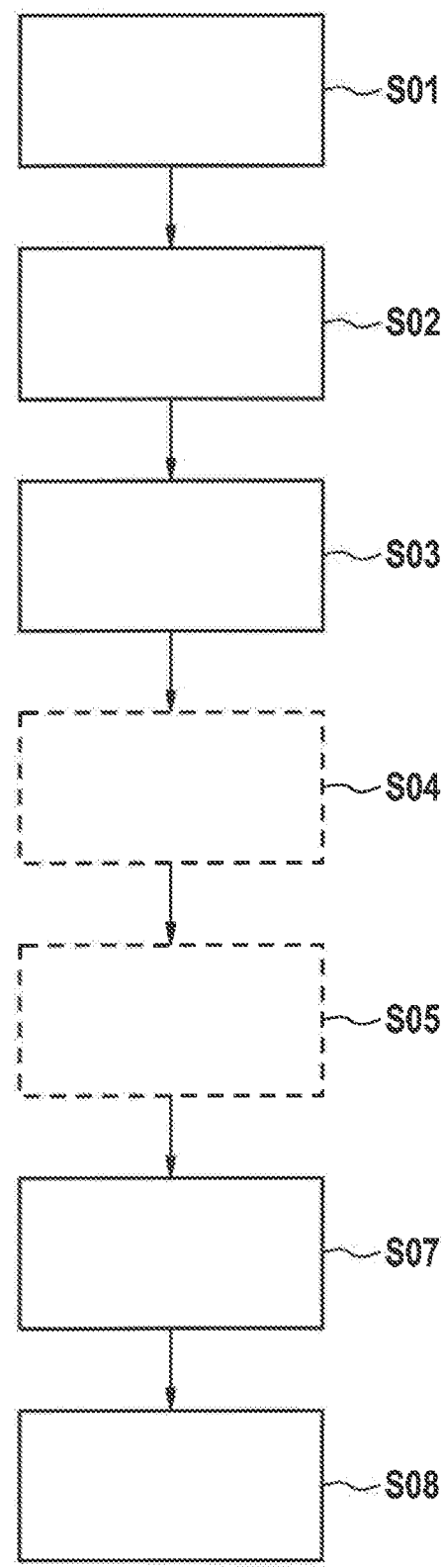
FIG. 13 is flowchart that illustrates a method for producing a microelectromechanical component according to yet another example embodiment of the present invention.

FIG. 13 shows a schematic flowchart for explaining a method for producing a microelectromechanical component 100o; 100p; 100q; 100r according to further example embodiments of the present invention.

The method as shown in FIG. 13 is a variant of one of the methods shown in FIGS. 1-9d as described above and differs from the latter in that in a step S07 another (e.g., a second) container structure 113a; 113b; 113c is disposed around base element 110a with the attached container structure 112a, preferably at the wafer level, and that in a step S08, preferably at the wafer level, another oil or gel 44 is disposed within the additional container structure 113a; 113b; 113c, as illustrated below with reference to FIGS. 14a through 14d.

FIGS. 14a-14d illustrate furthermore separated microelectromechanical components 100o-100r according to example embodiments of the present invention. Microelectromechanical components 100o-100r can also be situated in a multitude simultaneously on a common wafer 160 (e.g., up until separation) such that FIGS. 14a-14d also illustrate wafer systems according to example embodiments of the present invention.

In a variant illustrated with reference to FIG. 14a of the method according to FIG. 13, a container structure 113a is disposed around microelectromechanical component 100a, as was described with reference to FIG. 3a, on wafer 160, on which component 100a is also situated. As described with reference to FIG. 3a in relation to container structure 112a, container structure 113a can also be formed by patterning a polymer layer, in particular by photolithography and/or etching. Alternatively, however, other container structures, for example container structures 112b made of micromechanical caps, can also be disposed around a microelectromechanical component 100a on wafer 160.

In step S08, the additional oil or gel 44 is disposed in the additional container structure 113a. Especially if an oil is used, the additional container structure 113a can be subsequently closed as described above with reference to container structure 112a, i.e., in particular by a film or plate as sealing element 114a, by solder balls 114b, and so on.

Figure 14A:
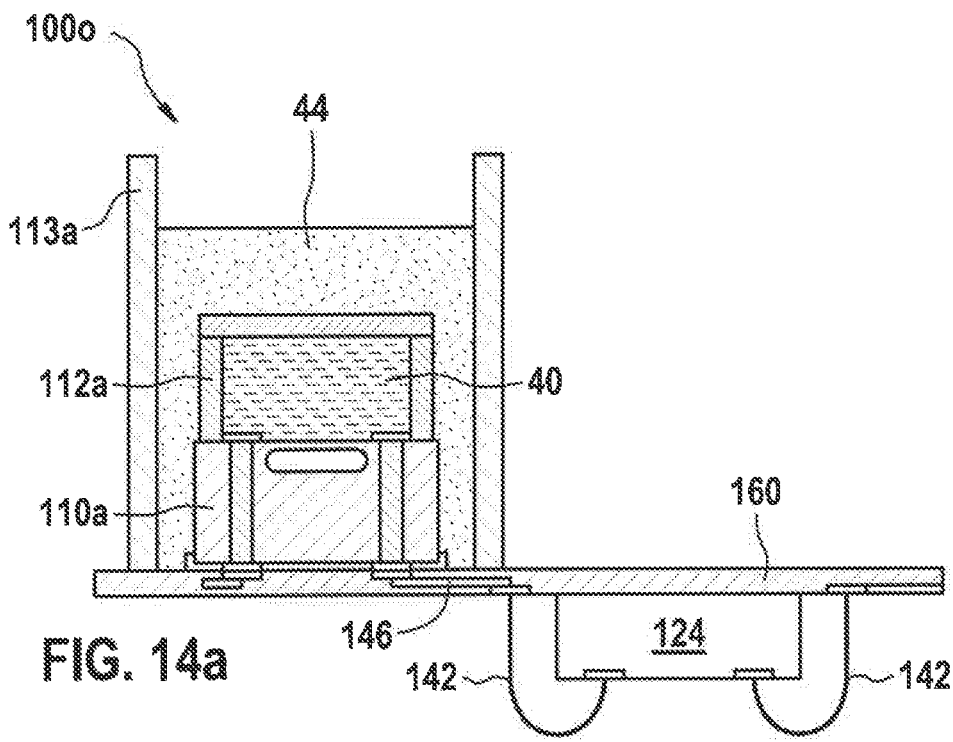
FIGS. 14a-14d are schematic cross-sectional representations of microelectromechanical components according to further example embodiments of the present invention.

In the method according to FIG. 14a, an ASIC 124, which is electrically connected to microelectromechanical component 100a, e.g., via through-hole contacts or buried conductors 146 through wafer 160 and/or bonding wires 142, is disposed on an outer side of wafer 160, which faces away from the outer side of wafer 160 on which microelectromechanical component 100a and the additional container structure 113a are situated. The system made up of wafer 160, component 100a or components 100a, container structure 113a or container structures 113a, and ASIC 124 or ASICs 124 connected thereto, as shown in FIG. 14a, can in turn be called a wafer system 100o or, following separation, a microelectromechanical component.

Figure 14B:
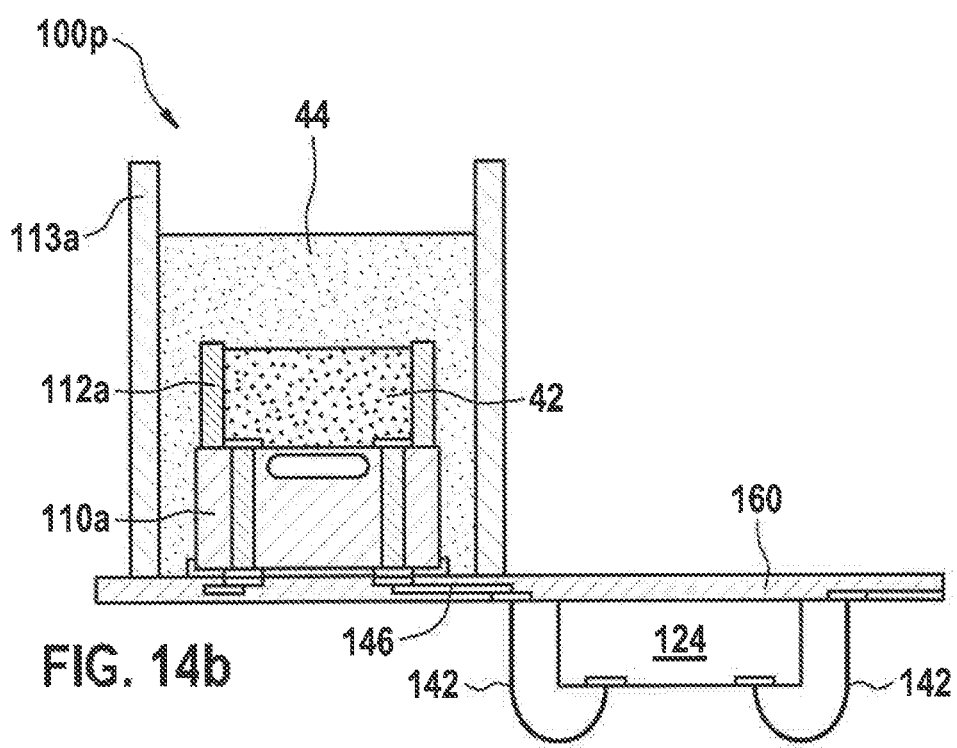
Figure 14C:
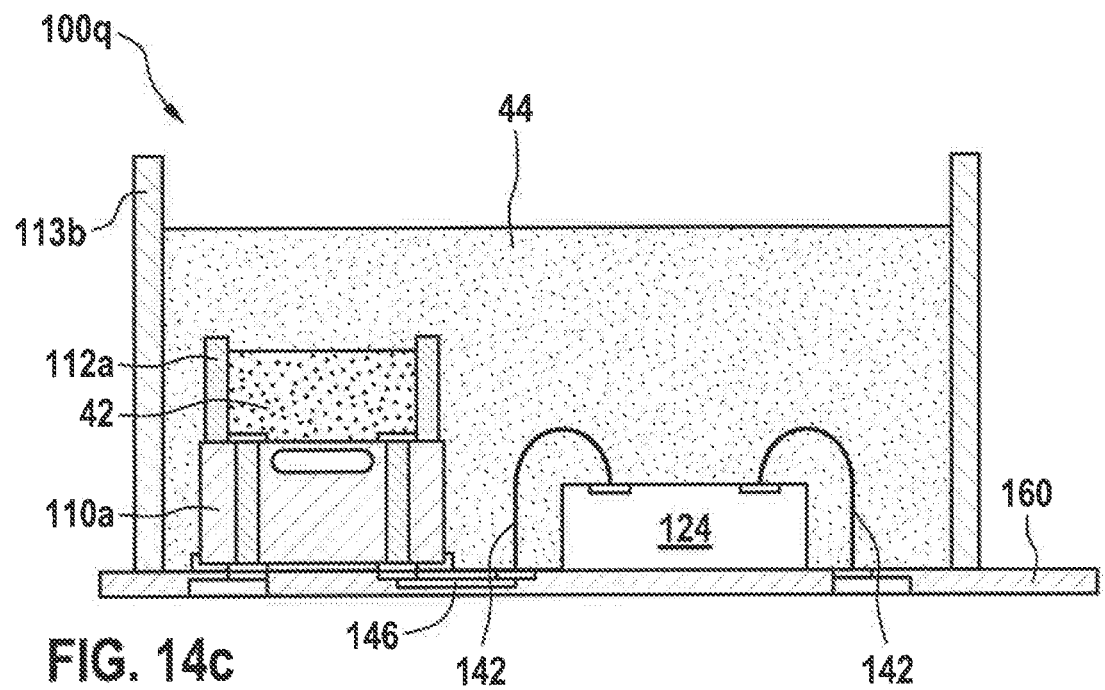

In a variant illustrated in FIG. 14b of the method according to FIG. 14a, component 100c according to FIG. 3c is used instead of component 100a according to FIG. 3a. Due to the inner cohesion and preferably greater viscosity, the additional gel 44, as shown in FIG. 14c, can have a boundary layer with respect to gel 42 within container structure 112a of component 100c. The system made up of wafer 160, component 100c or components 100c, container structure 113a or container structures 113a, and ASIC 124 or ASICs 124 connected thereto, as shown in FIG. 14b, can in turn be called a wafer system 100p or, following separation, a microelectromechanical component.

In a variant illustrated by FIG. 14c of the method according to FIG. 14b, ASIC 124 is situated on the same outer side of wafer 160 as microelectromechanical component 100a and is electrically connected to component 100a for example by bonding wires 142. A container structure 113a is situated around component 100a and ASIC 124, in which the additional gel 44 is situated, for example as described with reference to FIG. 14a. Thus, the additional gel 44 protects also the bonding wires 142 between ASIC 124 and component 100a against environmental influences. The system made up of wafer 160, component 100a or components 100a, container structure 113a or container structures 113a, and ASIC 124 or ASICs 124 connected thereto, as shown in FIG. 14c, can in turn be called a wafer system 100o or, following separation, a microelectromechanical component.

In wafer system 100o according to FIG. 14a, it is also possible for base element 110a and ASIC 124 to be situated on the same side of wafer 160.

Figure 14D:
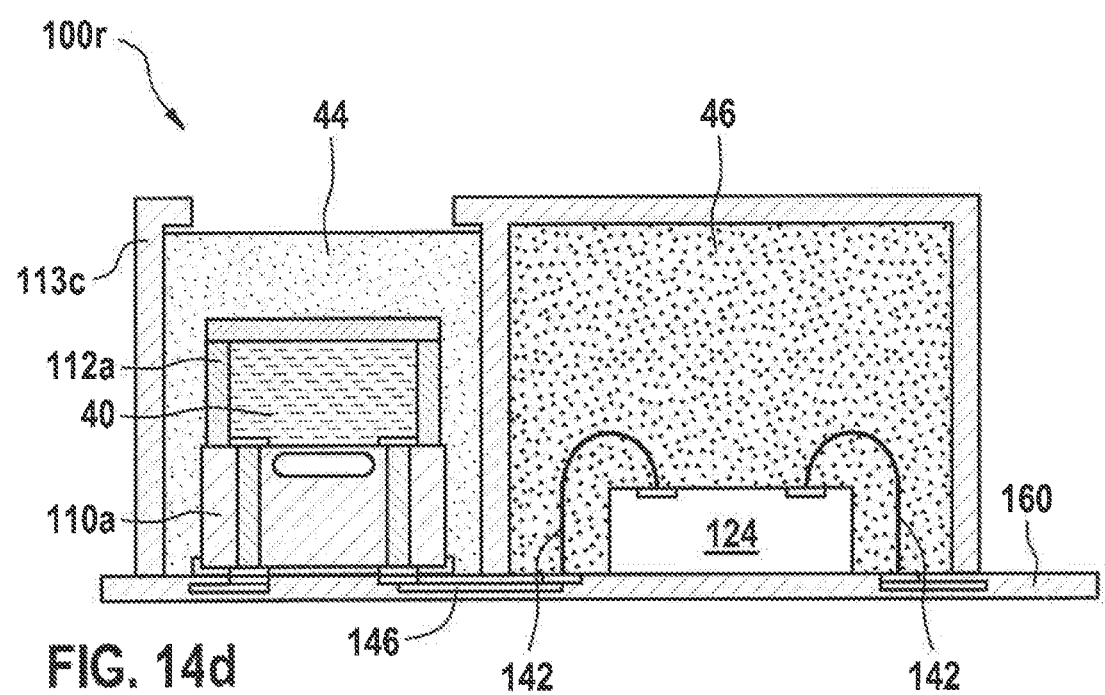

In a variant illustrated in FIG. 14d of the method according to FIG. 14b, a container structure 113c is situated on wafer 160, which has two chambers separated from each other, component 100a and additional gel 44 being situated in a first of the two chambers, and ASIC 124 and yet another gel 46 or oil being situated in a second of the two chambers. The two chambers can have a common wall, under which connecting lines can run for electrically connecting component 100a and ASIC 124, e.g., within wafer 160.

Technically, container structure 113c can be produced just as described with reference to container structure 112a. It is possible for an oil to be disposed in both chambers of container structure 113c or for a gel to be disposed in both chambers of container structure 113c. Each of the chambers can be sealed by a sealing element, as described above, in particular if an oil was disposed in the respective chamber.

Figure 15C:
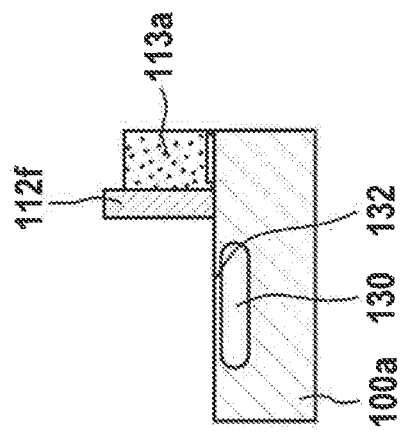
FIGS. 15a-15c are schematic cross-sectional representations of microelectromechanical components according to further example embodiments of the present invention.
Figure 15B:
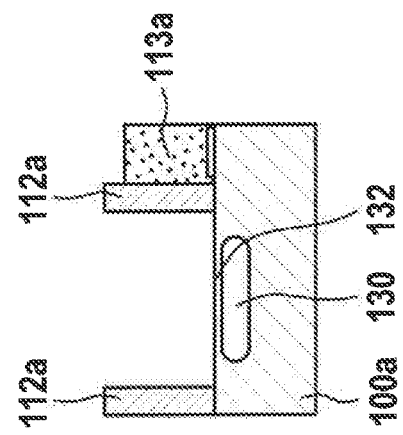
Figure 15A:
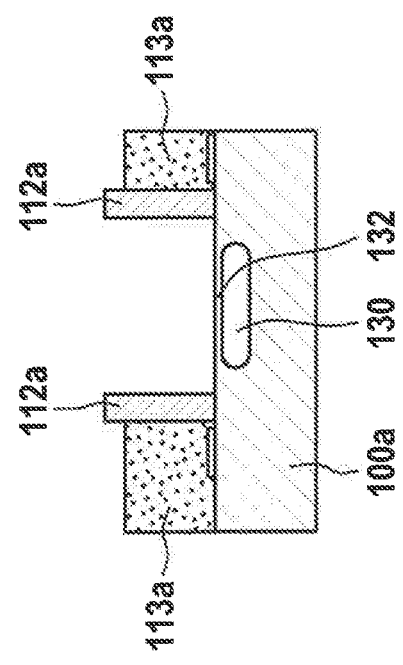

FIGS. 15a-15c illustrate that it is possible to use container structures, as were described above, e.g., container structures 112a made from a polymer layer, also to keep an epoxy resin (or another type of mass), which is used on a surface of a microelectromechanical base element 110a, away from an area, e.g., a diaphragm 132, on base element 110a that is to be kept clear. This can be done by an annular container structure 112a against a surrounding epoxy resin (or another type of mass), as shown in FIG. 15a, or by an annular container structure 112a against an epoxy resin (or another type of mass) present on one side, as shown in FIG. 15b, or by a separating structure 112f developed as a single wall, as shown in FIG. 15c. Separating structure 112f can be produced in the same manner as the container structures, in particular from a polymer layer 150.

Figure 16:
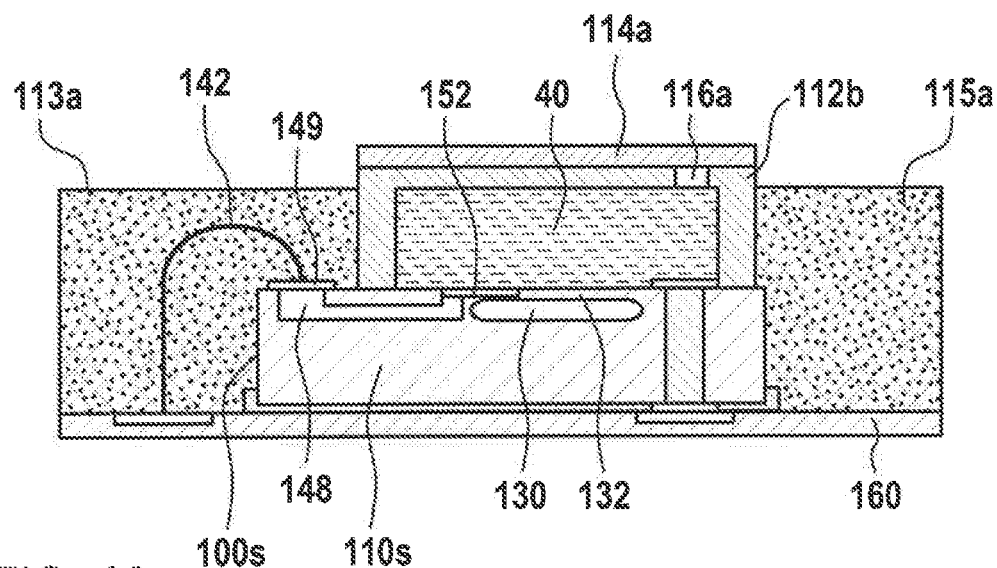
FIG. 16 is a schematic cross-sectional view of a microelectromechanical component according to an example embodiment of the present invention.

FIG. 16 shows a schematic cross-sectional view of a microelectromechanical component 100s according to an example embodiment of the present invention, which can likewise be produced using one of the described production methods. Component 100s is a variant of component 100d, which differs from component 100d in that a piezoelectric resistor 152 disposed within container structure 112a is electrically connected by a buried conductor 148 to a bonding pad 149 situated outside of container structure 112b, but on the same surface of base element 110s of component 100s as container structure 112b. Bonding pad 149 is electrically connected to wafer 160 via a bonding wire 142. The bonding pad, bonding wire 142, and base element 110s are encapsulated by a mass 115a, e.g., an epoxy resin. Container structure 112b thus separates the oil 40 disposed to protect diaphragm 132 from mass 115a.

Figure 17:
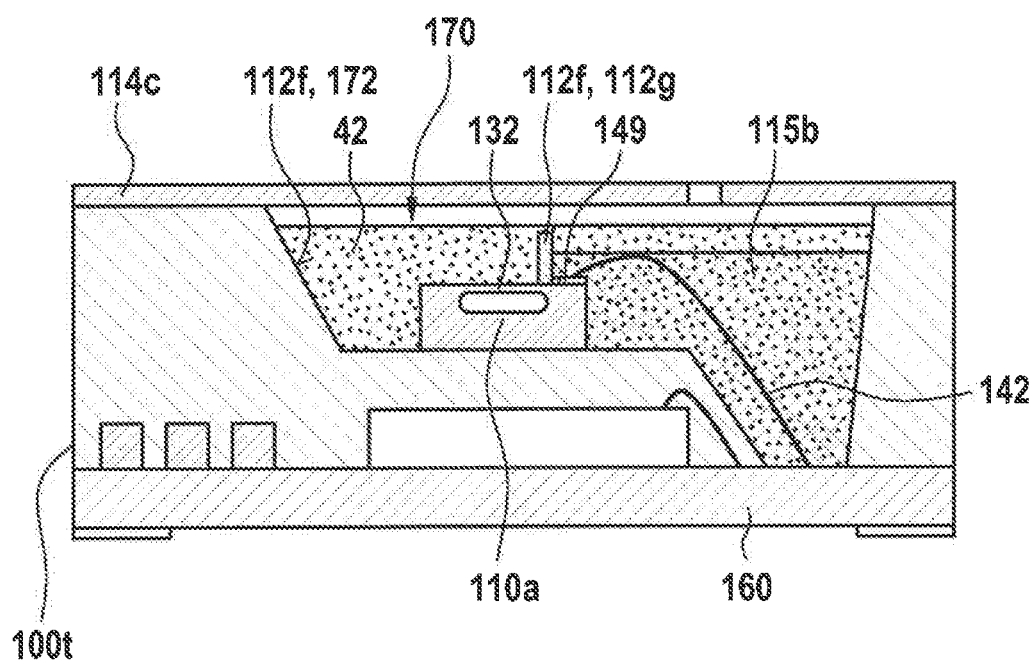
FIG. 17 a schematic cross-sectional view of a microelectromechanical component according to an example embodiment of the present invention.

FIG. 17 shows a schematic cross-sectional view of a microelectromechanical component 100s100t according to an example embodiment of the present invention. In component 100s100t, a base element 110a is provided with a separating structure 112f, as shown in FIG. 15c, and is disposed within a cavity 170 that is developed in such a way that an inner side wall 172 of cavity 170 together with separating structure 112f forms a container structure 112g. A gel 42 is disposed within container structure 112g, which protects diaphragm 132 of base element 110a against environmental influences.

On a side of separating structure 112f facing away from gel 42, another mass 115b, for example another gel or an epoxy resin, is disposed likewise within cavity 170, which is kept away from gel 42 by separating structure 112f. A bonding pad 149 and a bonding wire 142 can be encapsulated in mass 115b. Cavity 170 can be sealed by a sealing element 114c, which can be developed for example like sealing element 114a.

In all methods described above, the base element can also be another microelectromechanical component, other than a MEMS pressure sensor, for example an application-specific integrated circuit. Instead of protecting a diaphragm of a MEMS pressure sensor, the oil or the gel can protect a contact or a through-hole contact of the application-specific integrated circuit against environmental influences. Contacts on a side or surface of the base element or the wafer that are not protected by the container structure or the oil or gel disposed therein can be protected by an underfill for example.

In all cases in which a micromechanical or microelectromechanical structure for forming the container structure is connected to the base element, this structure can have a cantilever, in particular in its cover, via which the structure can be filled with the oil or the gel after being connected to the base element, and which due to restoring forces subsequently swings back into a position in which the oil or the gel remains enclosed within the structure. In such a variant, a separate sealing element can be omitted, which reduces the technical expenditure. Such variants having a cantilever can be developed as described above with reference to FIGS. 10a-12b.

What is claimed is:

1. A method for producing a microelectromechanical component, the method comprising:
   providing a first wafer with a plurality of microelectromechanical base elements, wherein the microelectromechanical base elements are pressure sensors that each includes a respective pressure sensor diaphragm;
   while the plurality of microelectromechanical base elements are on the first wafer, connecting a second wafer to the first wafer to attach at least one microelectromechanical or micromechanical structure on the microelectromechanical base elements, thereby forming respective container structures around or on respective ones of the microelectromechanical base elements, wherein the respective container structures are each disposed and developed such that an outer side of the pressure sensor diaphragm of the respective base elements is covered by an oil or gel disposed in the respective container structures; and
   disposing the oil or a gel within the container structures.

2. The method of claim 1, wherein:
   the microelectromechanical base elements are electrically and/or mechanically connected to the first wafer; and
   the method further comprises:
      forming a super container structure around the microelectromechanical base elements and their the respective container structures; and
      disposing another gel in the super container structure.

3. The method of claim 1, wherein, within the container structure, in addition to the oil or the gel, a respective application-specific integrated circuit (ASIC) is disposed and connected electrically and mechanically to the respective microelectromechanical base element.

4. The method of claim 1, wherein:
   the disposing is of the oil;
   the disposing of the oil is performed by filling the oil into a filler opening in the container structure; and
   after disposing the oil the filler opening is closed.

5. The method of claim 1, wherein the second wafer is a glass wafer, from which glass covers are formed as the container structures for the microelectromechanical base elements on the first wafer.

6. The method of claim 5, wherein the second wafer is connected to the first wafer by anodic wafer bondings.

7. The method of claim 1, wherein the forming of the respective container structures includes a simultaneous attachment of the container structures to their respective base elements.

8. The method of claim 7, wherein the container structures are microelectromechanical container structures.

9. The method of claim 7, wherein the contained structures are micromechanical container structures.

10. A wafer system comprising:
    a first wafer;
    a plurality of microelectromechanical base elements on the first wafer, wherein the microelectromechanical base elements are pressure sensors that each includes a respective pressure sensor diaphragm;
    container structures disposed around or on respective ones of the microelectromechanical base elements, wherein the container structures are formed by a second wafer connected to the first wafer, wherein the each container structure is disposed and developed such that an outer side of the respective pressure sensor diaphragm of the respective base element is covered by an oil or gel disposed in the respective container structures; and
    the oil or a gel disposed in the container structures.

11. The wafer system of claim 10, wherein:
    the microelectromechanical base elements are electrically and/or mechanically connected to the first wafer; and
    the wafer system further comprises:
       a super container structure around the microelectromechanical base elements and their the respective container structures; and
       disposing another gel in the super container structure.

12. A microelectromechanical component comprising:
    a wafer;
    at least one microelectromechanical base element disposed on the wafer, the at least one microelectromechanical base element being a pressure sensor that includes a respective pressure sensor diaphragm;
    at least one first container structure, including a respective first container structure around or on a respective one of the at least one microelectromechanical base element;
    an oil or a gel disposed in the at least one first container structure, wherein the first container structure is disposed and developed such that an outer side of the pressure sensor diaphragm of the base element is covered by the oil or gel disposed in the first container structure;
    a second container structure disposed on the wafer around the at least one microelectromechanical base element and the at least one first container structure; and
    another oil or gel disposed in the second container structure and around the at least one first container structure.

* * * * *